United States Patent [19]

Loder et al.

[11] Patent Number: 5,777,345

[45] Date of Patent: Jul. 7, 1998

[54] MULTI-CHIP INTEGRATED CIRCUIT PACKAGE

[75] Inventors: William G. Loder, Chandler; John Francis McMahon, Phoenix, both of Ariz.

[73] Assignee: Intel Corporation, Santa Clara, Calif.

[21] Appl. No.: 581,021

[22] Filed: Jan. 3, 1996

[51] Int. Cl.⁶ .......................... H01L 23/48; H01L 23/52; H01L 29/40
[52] U.S. Cl. ............... 257/777; 257/686; 257/784; 257/786; 257/675
[58] Field of Search ........................... 256/675.6, 707, 256/777, 796, 686, 784, 786

[56] References Cited

U.S. PATENT DOCUMENTS

| | | | |
|---|---|---|---|
| 5,177,669 | 1/1993 | Juskey et al. | 257/625 |
| 5,216,283 | 6/1993 | Lin | 257/796 |
| 5,422,435 | 6/1995 | Takiar et al. | 257/777 |

FOREIGN PATENT DOCUMENTS

| | | | |
|---|---|---|---|
| 3165550 | 7/1991 | Japan | 257/777 |
| 4 99056 | 3/1992 | Japan | 257/777 |

OTHER PUBLICATIONS

"COB and COC for Low Cost and High Density Package", Geroges Rochat, 1995 IEEE/CPMT Int'l Electronics Manufacturing Technology Symposium, pp. 109–111.

*Primary Examiner*—Mahshid D. Saadat
*Assistant Examiner*—T. M. Arroyo
*Attorney, Agent, or Firm*—Blakely, Sokoloff, Taylor & Zafman

[57] ABSTRACT

An electronic package which has a plurality of stacked integrated circuit dies. The package includes a first die that is mounted to a die paddle of a lead frame. The first die is also connected to the leads of the lead frame by bond wires. A second die is mounted to the top surface of the first die and electrically connected to the first die with bond wires. The first die, second die and die paddle are all enclosed by a package.

17 Claims, 2 Drawing Sheets

MULTI-CHIP INTEGRATED CIRCUIT PACKAGE

BACKGROUND OF THE INVENTION

1. Field of the Invention

The present invention relates to a package for an integrated circuit.

2. Description of Related Art

Integrated circuits (ICs) are typically housed within a package that is mounted to a printed circuit board assembly. The prior art includes a plastic package which is commonly referred to as a quad flat pack (QFP). A QFP package typically contains a lead frame which has a plurality of leads that extend from an outer plastic package. The plastic encapsulates an integrated circuit that is coupled to the lead frame. The plastic package is typically produced by first mounting the integrated circuit onto a die paddle of the lead frame, and then interconnecting the IC to the frame with a plurality of wire bonds. The integrated circuit and lead frame are then placed into a mold that is injected with a plastic dielectric material. The plastic material hardens and the assembly is removed from the mold. The lead frame is then trimmed and bent into a final configuration.

A final board assembly typically contains a number of integrated circuit packages mounted to a printed circuit board (PCB). The IC circuits communicate through the packages and the PCB. The inductance, capacitance and overall impedance of the packages and board are designed to minimize noise on the signals transmitted between the integrated circuits. For high speed integrated circuits signal noise can be critical. To reduce noise, shorten trace lengths and the size of the printed circuit board, there have been utilized multichip modules (MCM) which can contain two or more integrated circuits. Multichip modules typically have a number of individual electronic devices mounted within the package in a laterally adjacent manner. The minimum footprint of a multichip module is limited by the outer dimensions of all the individual elements. Additionally, present multichip module substrates are typically constructed from ceramic, silicon, metal or printed circuit board materials which are relatively more expensive to produce than a plastic QFP. It would be desirable to provide an electronic package which has a minimal footprint and can be assembled with conventional plastic injection molding techniques without adding expensive interconnecting substrate components.

SUMMARY OF THE INVENTION

The present invention is an electronic package which has a plurality of stacked integrated circuit dies. The package includes a first die that is mounted to a die paddle of a lead frame. The first die is also connected to the leads of the lead frame by bond wires. A second die is mounted to the top surface of the first die and electrically connected to the first die with bond wires. The first die, second die and die paddle are all enclosed by a package.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
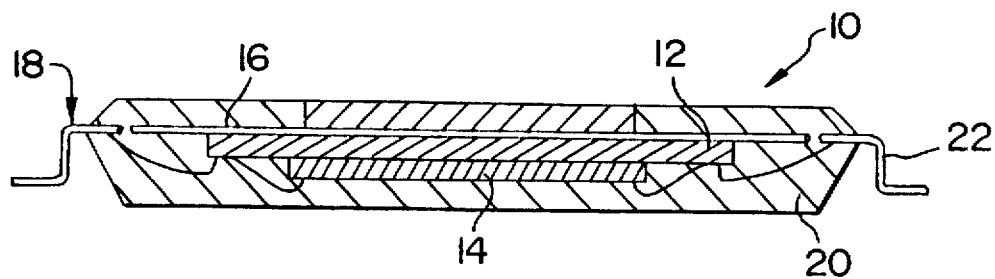
FIG. 1 is a cross-sectional view of an electronic package of the present invention.

Referring to the drawings more particularly by reference numbers, FIG. 1 shows an integrated circuit package 10 of the present invention. The package 10 contains a first die 12 and a second die 14. The first die 12 is mounted to a die paddle 16 of a lead frame 18. The first die 12 can be attached to the die paddle 16 by an epoxy, adhesive or any other suitable mounting material. The mounting material should preferably have a relatively high coefficient of thermal and/or electrical conductivity to improve the thermal and/or electrical efficiency of the package. The first die 12, second die 14 and die paddle 16 are encapsulated by a plastic to form a package 20. The lead frame 18 is typically constructed from an electrically conductive material such as copper alloy and contains a plurality of individual leads 22 that extend from the outer surface of the package 20. The package 10 is typically mounted to a printed circuit board (not shown) by soldering the ends of the leads 22 to corresponding pads of the printed circuit board. The leads 22 are typically bent into the gull-wing configuration shown. The stacked die arrangement reduces the overall length (footprint) of the package and size of the printed circuit board. The package of the present invention is therefore ideally suitable for products such as cellular phones or other relatively high density electronic devices.

Figure 2:
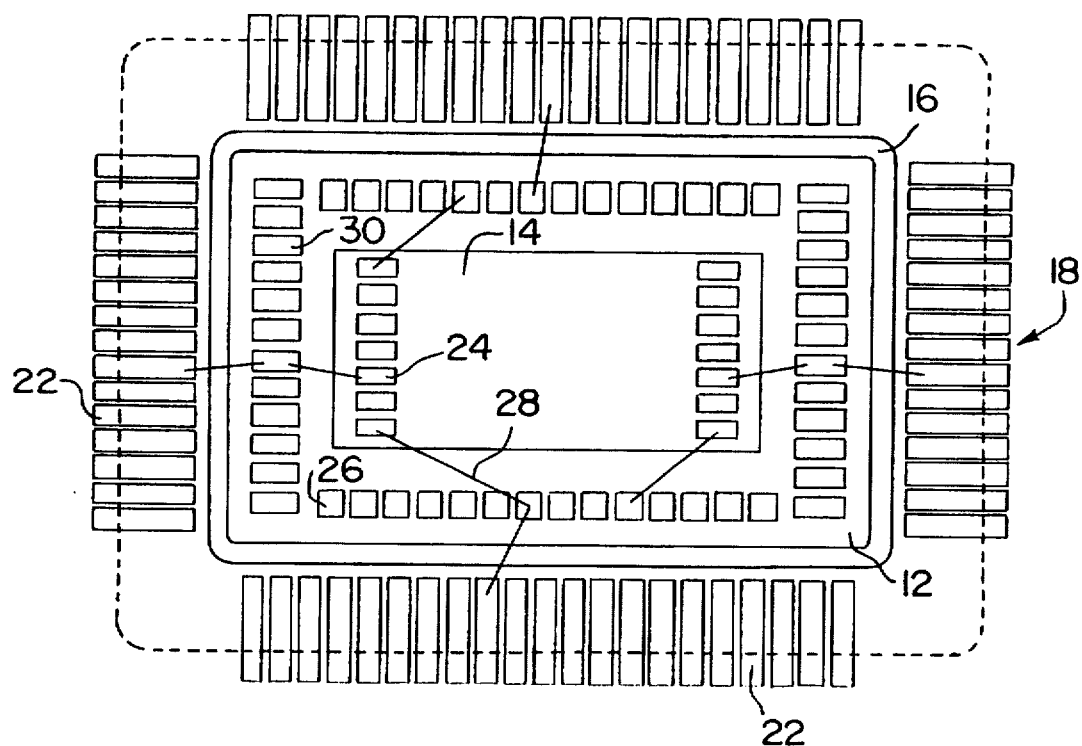
FIG. 2 is a top view showing a pair of integrated circuit dies and a lead frame.

As shown in FIG. 2, the second die 14 has a plurality of bonding pads 24 that are connected to a plurality of bonding pads 26 on the first die 12 by bond wires 28. The bonding pads 26 of the first die 12 are connected to the leads 22 of the lead frame 18 by bond wires 28. Alternatively, all or some of the bonding pads 24 of the second die 14 may be bonded directly to the leads 22 of the lead frame 18. Connecting the bonding pads 24 of the second die 14 to the bonding pads 26 of the first die 12 provides a direct bus between the two device without routing between the lead frame 22 or an external printed circuit board. The direct bus reduces the signal noise between the devices. Additionally, the direct bus reduces the number of leads (pins) and the overall size of the package 10.

In the preferred embodiment, the first die 12 is a microprocessor and the second die 14 is a memory device. Alternatively, the second die 14 may be a memory device and the first die 12 may be an interposer. Referring to FIG. 2, the memory device 14 typically has bonding pads 24 located at two opposing ends of the die 14. The interposer 12 contains bonding pads 26 located along all four sides of the die 12. The bonding pads 26 of the interposer 12 are connected to corresponding leads 22 in each quadrant of the lead frame 18. The four rows of bonding pads 26 on the interposer 12 "fan out" the interconnect from the two rows of second die bonding pads 24 to the lead frame 18. The interposer 12 therefore allows a conventional two row memory device to be attached to a conventional four row lead frame without having to redesign either the device 14 or the lead frame 18.

Figure 3:
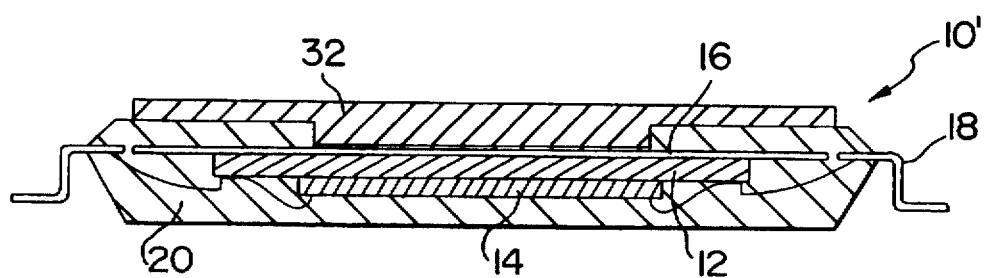
FIG. 3 is a cross-sectional view showing an alternate embodiment of the electronic package.

FIG. 3 shows an alternate embodiment of an electronic package 10' which has a heat slug 32 incorporated therein.

The heat slug 32 extends through a hole in the package and is attached to the back side of the die paddle 16. The heat slug 32 extends from the die paddle 16 to the outer surface of the package 20.

Figure 4:
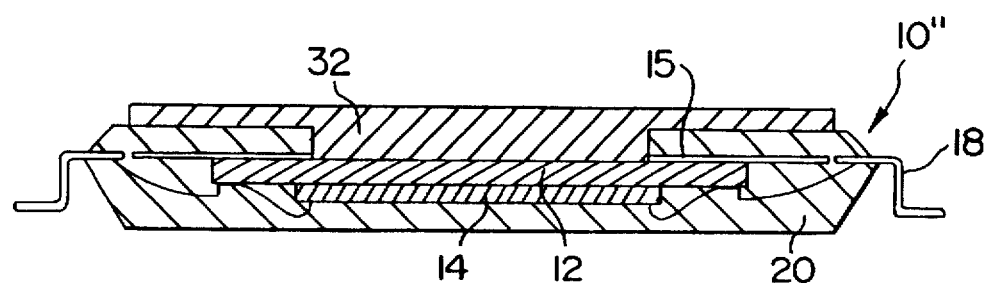
FIG. 4 is a cross-sectional view showing an alternate embodiment of the electronic package.

FIG. 4 shows another alternate embodiment of a package 10" that has a heat slug 32 attached to the back side of the first die 12 through a hole in the die paddle 16. The dies create heat that must be removed from the package. The heat transfer rate from the package must be sufficient to maintain the junction temperatures of the integrated circuits below a critical value. The heat slug 32 provides a thermal path from the dies to the ambient that has a relatively low thermal resistance. The heat slug 32 therefore improves the overall thermal efficiency of the package. The heat slug 32 is preferably constructed from a material that is both thermally conductive and has a coefficient of thermal expansion that causes the overall package to match the thermal coefficient of the printed circuit board on which the package is mounted.

Figure 5:
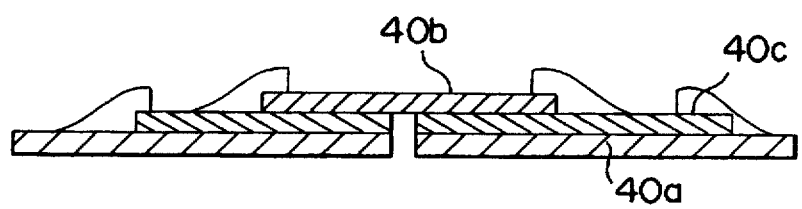
FIG. 5 is a cross-sectional view showing an alternate embodiment of an electronic package which has a plurality of discrete devices stacked in a pyramid arrangement.

FIG. 5 shows another alternate package embodiment, wherein multiple dies 40a–c are stacked in a pyramid arrangement. Each upper die is mounted and electrically connected to an adjacent lower die by wire bonds. The lowest dies are then connected to the lead frame (not shown) of the package. The "pyramid" stack of dies may be assembled within a package that has a heat sink 32, as shown in FIGS. 3 and 4, or does not have a heat sink 32, as shown in FIG. 1. The top die 40b bridges two lower adjacent dies 40c. Although five dies are shown and described, it is to be understood that three or any number of dies may be stacked in the arrangements shown and described.

The packages 10 of the present invention are preferably assembled by mounting the first die 12 onto the die paddle 16 and mounting the second die 14 onto the first die 12. The bonding pads of the dies are then connected to each other and the lead frame 18 by a wire bonding process. Although the process is described as first mounting both dies to the die paddle and then wire bonding the device, it is to be understood that the order of steps may be altered. For example, the second die 14 may be mounted and wire bonded to the first die 12, before the first die 12 is mounted to the die paddle 16.

The lead frame and dies are placed into a mold (not shown). A plastic dielectric material is then injected into the mold cavity to create the outer package 20. If a heat slug 32 is to be incorporated into the package, the slug 32 can also be placed into the mold. Alternatively, the mold can be constructed to create a hole in the package, wherein the heat slug 32 is mounted into the hole after the plastic material has cured.

The package is removed from the mold after the plastic package has cured. The leads of the lead frame are then trimmed and bent into a final configuration. The present invention thus provides a multichip package that has a relatively small footprint and can be assembled using conventional plastic molding techniques.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. Although a plastic package is shown and described, it is to be understood that the dies may be stacked within a ceramic package or metal based electronic package marketed under the trademark MQUAD.

What is claimed is:

1. An electronic package, comprising:

a first die that has a plurality of bonding pads on a first end, a second end, a third end and a fourth end;

a second die mounted to said first die, wherein said second die has a plurality of bonding pads located only on a first end and an opposite second end;

a package that encloses said first and second dies;

a conductive routing circuit that is located within said package and is connected to said first die;

a plurality of first wire bonds that connect said bonding pads on said first and second ends of said second die to said bond pads of said first, second, third and fourth ends of said first die; and, a plurality of second wire bonds that connect said bonding pads of said first die to said conductive routing circuit.

2. The package as recited in claim 1, wherein said second die is electrically connected to said first die.

3. The package as recited in claim 1, wherein said first die is a microprocessor.

4. The package as recited in claim 3, wherein said second die is a memory device.

5. The package as recited in claim 1, wherein said conductive routing circuit is a lead frame.

6. The package as recited in claim 5, wherein said first die is mounted to a die paddle of said lead frame.

7. The package as recited in claim 6, further comprising a heat slug attached to said die paddle.

8. The package as recited in claim 6, further comprising a heat slug that extends through a hole in said die paddle and is attached to said first die.

9. The package as recited in claim 5, wherein said package is constructed from a plastic material.

10. The package as recited in claim 1, further comprising a third die mounted to said second die.

11. The package as recited in claim 1, wherein said conductive routing circuit is within a ceramic package.

12. An electronic package, comprising:

a lead frame that has a die paddle;

a first die mounted to said die paddle, wherein said first die has a plurality of bonding pads on a first end, a second end, a third end and a fourth end;

a second die mounted to said first die, wherein said second die has a plurality of bonding pads located only on a first end and an opposite second end;

a plurality of first wire bonds that connect said second die to said first die;

a plurality of second wire bonds that connect said first die to lead frame; and, a package that encloses said first die, said second die and said die paddle of said lead frame.

13. The package as recited in claim 12, wherein said first die is a microprocessor.

14. The package as recited in claim 13, wherein said second die is a memory device.

15. The package as recited in claim 12, further comprising a heat slug attached to said die paddle.

16. The package as recited in claim 12, further comprising a heat slug that extends through a hole in said die paddle and is attached to said first die.

17. The package as recited in claim 12, further comprising a third die mounted to said second die.

* * * * *